(12) United States Patent
Özkök et al.

(10) Patent No.: US 12,063,751 B2
(45) Date of Patent: Aug. 13, 2024

(54) MANUFACTURING SEQUENCES FOR HIGH DENSITY INTERCONNECT PRINTED CIRCUIT BOARDS AND A HIGH DENSITY INTERCONNECT PRINTED CIRCUIT BOARD

(71) Applicant: Atotech Deutschland GmbH & Co. KG, Berlin (DE)

(72) Inventors: Akif Özkök, Berlin (DE); Bert Reents, Berlin (DE); Mustafa Özkök, Berlin (DE); Marko Mirkovic, Berlin (DE); Markus Youkhanis, Berlin (DE); Horst Brüggmann, Berlin (DE); Sven Lamprecht, Berlin (DE); Kai-Jens Matejat, Berlin (DE)

(73) Assignee: Atotech Deutschland GmbH & Co. KG, Berlin (DE)

( * ) Notice: Subject to any disclaimer, the term of this patent is extended or adjusted under 35 U.S.C. 154(b) by 153 days.

(21) Appl. No.: 17/636,500

(22) PCT Filed: Aug. 19, 2020

(86) PCT No.: PCT/EP2020/073185
§ 371 (c)(1),
(2) Date: Feb. 18, 2022

(87) PCT Pub. No.: WO2021/032775
PCT Pub. Date: Feb. 25, 2021

(65) Prior Publication Data
US 2022/0304164 A1 Sep. 22, 2022

(30) Foreign Application Priority Data
Aug. 19, 2019 (EP) .................................... 19192262

(51) Int. Cl.
*H05K 3/42* (2006.01)
*C25D 3/38* (2006.01)
(Continued)

(52) U.S. Cl.
CPC ............... *H05K 3/425* (2013.01); *C25D 3/38* (2013.01); *C25D 5/022* (2013.01); *C25D 5/18* (2013.01);
(Continued)

(58) Field of Classification Search
CPC ............. C25D 5/022; C25D 5/18; C25D 5/02
See application file for complete search history.

(56) References Cited

U.S. PATENT DOCUMENTS

| | | | |
|---|---|---|---|
| 5,976,341 A | 11/1999 | Schumacher et al. | |
| 6,099,711 A | 8/2000 | Dahms et al. | |

(Continued)

FOREIGN PATENT DOCUMENTS

| | | |
|---|---|---|
| EP | 1264918 A1 | 12/2002 |
| WO | 2005076681 A1 | 8/2005 |

(Continued)

OTHER PUBLICATIONS

PCT/EP2020/073185; International Search Report and Written Opinion of the International Searching Authority dated Oct. 16, 2020.

*Primary Examiner* — Brian W Cohen
(74) *Attorney, Agent, or Firm* — Renner, Otto, Boisselle & Sklar, LLP

(57) ABSTRACT

The present invention refers to a method of preparing a high density interconnect printed circuit board (HDI PCB) including microvias filled with copper comprising the steps of:
  a1) providing a multi-layer substrate comprising
    (i) a stack assembly of an electrically conductive interlayer embedded between two insulating layers, (Continued)

(ii) a cover layer, and
(iii) a microvia extending from the peripheral surface and ending on the conductive interlayer;
b1) depositing a conductive layer; or
a2) providing a multi-layer substrate comprising
(i) a stack assembly of an electrically conductive interlayer embedded between two insulating layers,
(ii) a microvia extending from the peripheral surface and ending on the conductive interlayer;
b2) depositing a conductive layer;
and
c) electrodepositing a copper filling in the microvia and a first copper layer on the conductive layer which form together a planar surface and the thickness of the first copper layer is from 0.1 to 3 µm.

19 Claims, 15 Drawing Sheets

(51) Int. Cl.
| | |
|---|---|
| *C25D 5/02* | (2006.01) |
| *C25D 5/18* | (2006.01) |
| *C25D 7/00* | (2006.01) |
| *H01L 21/48* | (2006.01) |
| *H05K 3/10* | (2006.01) |

(52) U.S. Cl.
CPC ............ *C25D 7/00* (2013.01); *H01L 21/4857* (2013.01); *H01L 21/486* (2013.01); *H05K 3/423* (2013.01); *H05K 3/429* (2013.01); *H05K 3/108* (2013.01); *H05K 2203/072* (2013.01); *H05K 2203/0723* (2013.01); *H05K 2203/1492* (2013.01)

(56) References Cited

U.S. PATENT DOCUMENTS

| | | |
|---|---|---|
| 8,784,634 B2 * | 7/2014 | Reents .................... C25D 5/18 205/291 |
| 2007/0163887 A1 | 7/2007 | Hofmann |
| 2009/0301889 A1 | 12/2009 | Reents et al. |
| 2014/0245954 A1 | 9/2014 | Minami et al. |
| 2014/0322912 A1 * | 10/2014 | Paneccasio, Jr. ........ C25D 3/38 438/675 |
| 2015/0289387 A1 | 10/2015 | Mirkovic et al. |
| 2018/0010258 A1 * | 1/2018 | Fujiwara ................ C25D 21/12 |

FOREIGN PATENT DOCUMENTS

| | | |
|---|---|---|
| WO | 2006032346 A1 | 3/2006 |
| WO | 2010094998 A1 | 8/2010 |
| WO | 2013092131 A1 | 6/2013 |

* cited by examiner

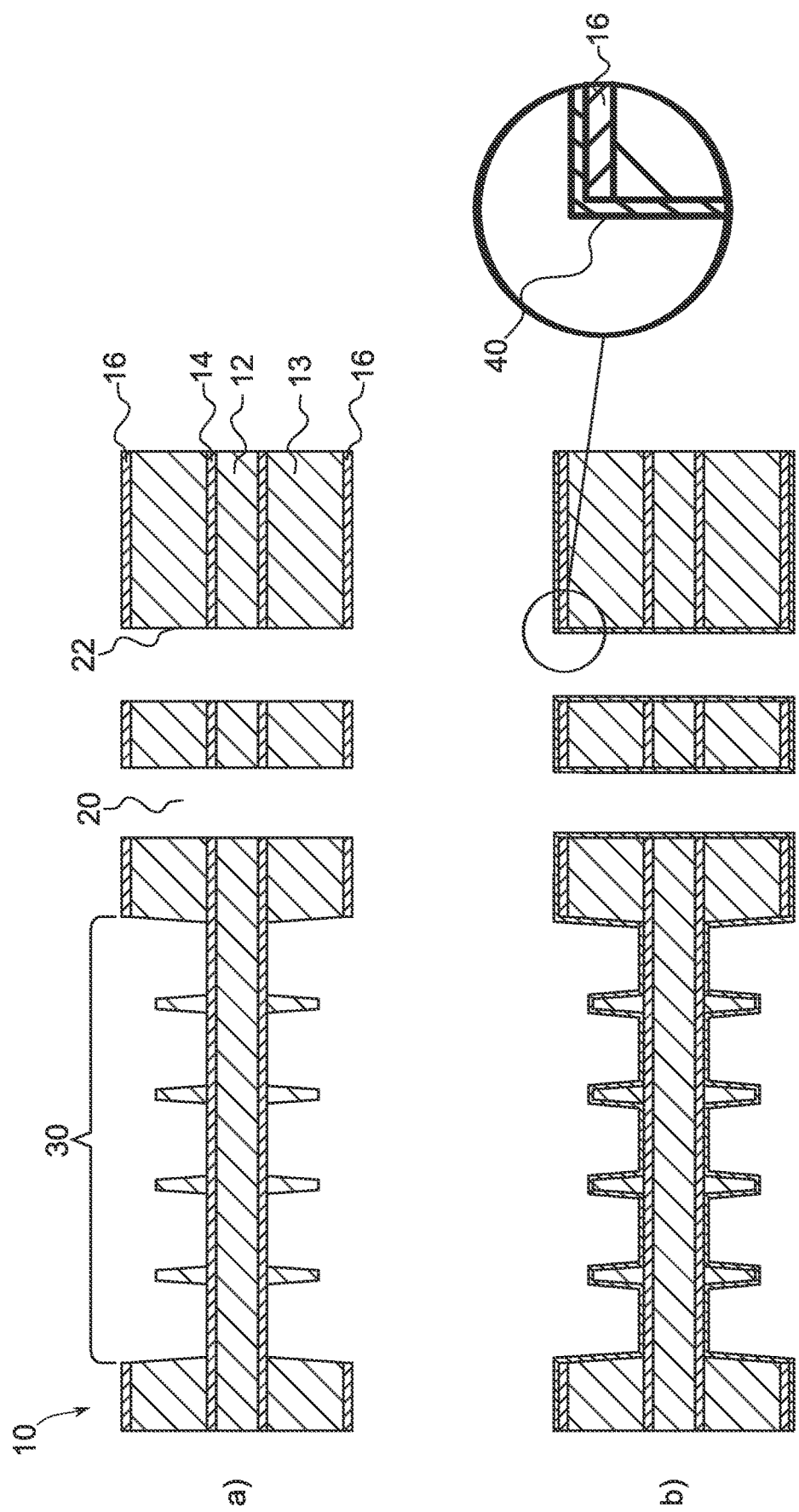

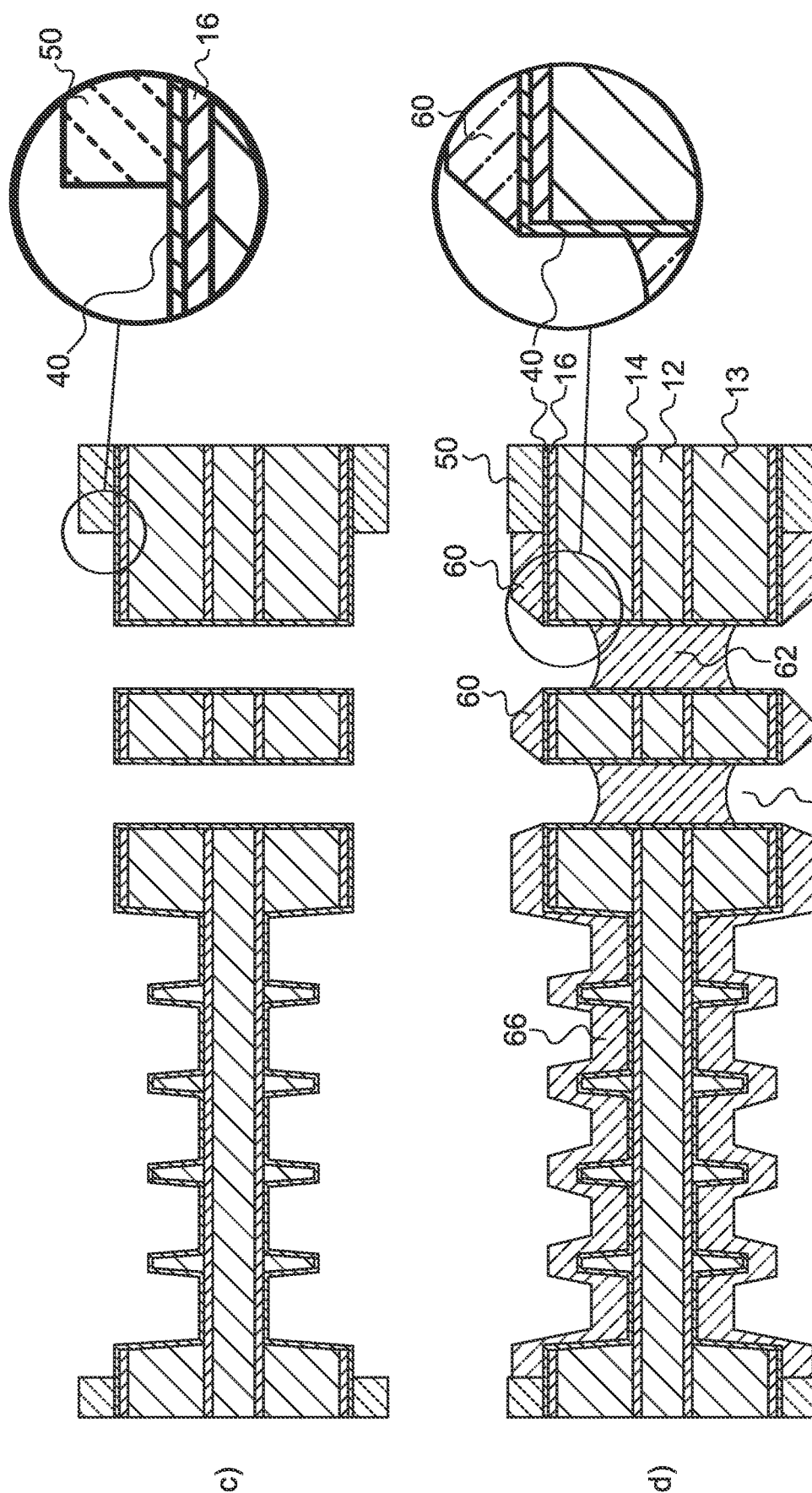

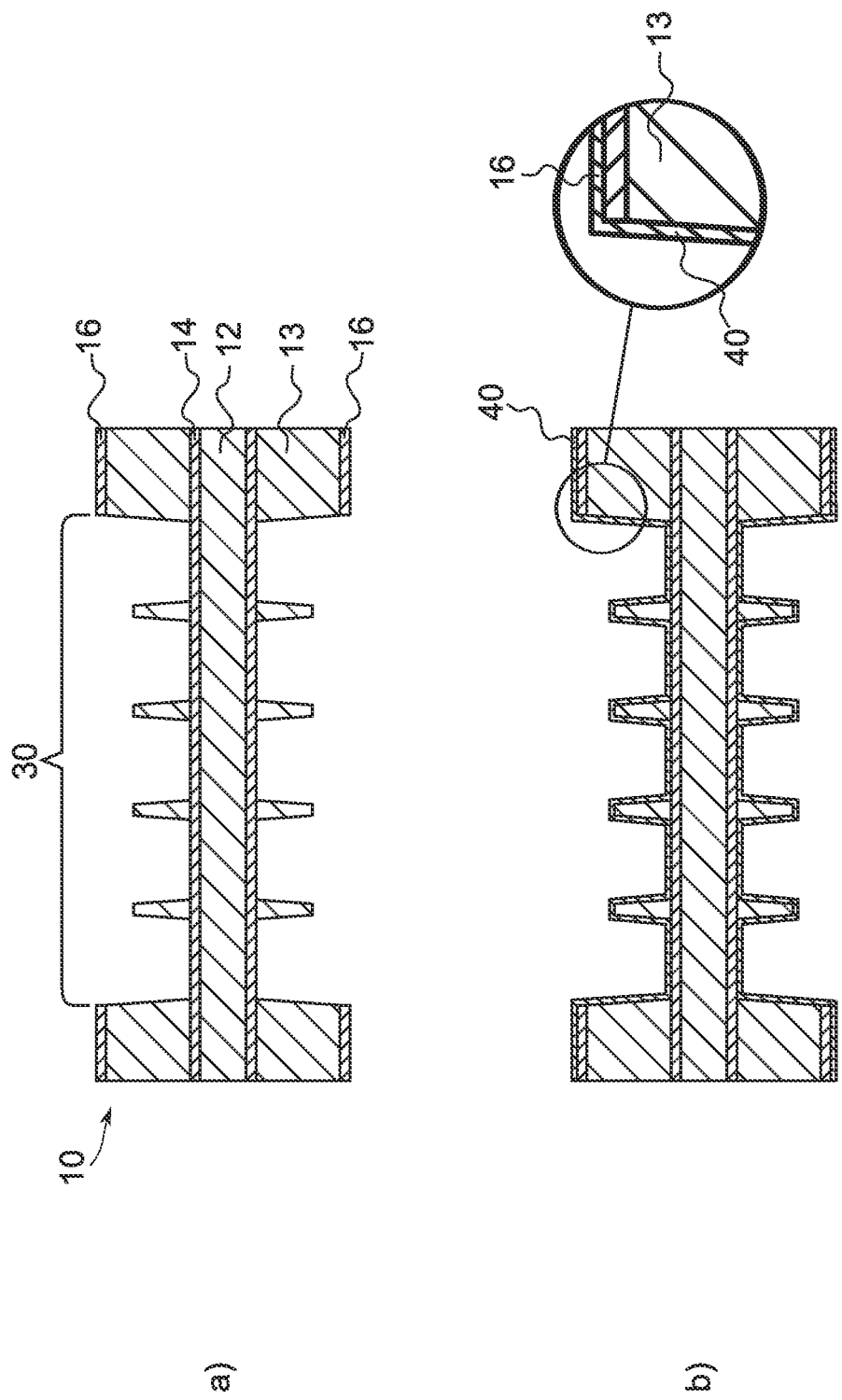

MANUFACTURING SEQUENCES FOR HIGH DENSITY INTERCONNECT PRINTED CIRCUIT BOARDS AND A HIGH DENSITY INTERCONNECT PRINTED CIRCUIT BOARD

This application is a national phase of International Application No. PCT/EP2020/073185 filed 19 Aug. 2020, which claims priority to European Patent Application No. 19192262.4 filed 19 Aug. 2019, the entire disclosures of which are hereby incorporated by reference.

FIELD OF THE INVENTION

The present invention relates to manufacturing sequences for high density interconnect printed circuit boards (HDI PCB) and a high density interconnect printed circuit board obtained by the manufacturing sequence.

TECHNOLOGICAL BACKGROUND

At present high density interconnect printed circuit boards (HDI PCB) are manufactured by means of methods such as subtractive process, Semi-Additive Process (SAP), modified Semi-Additive Process (mSAP) or advanced modified Semi Additive Process (amSAP). In particular, mSAP and amSAP constitute promising variations for manufacturing the next generation of HDI PCBs allowing ultrafine microvia structures, line/space width≤30 μm (L/S) and therefore providing higher complexity of interconnection.

Further, heat dissipation structures need to be integrated into HDI PCBs to prevent local overheating. Such heat dissipation structures may, for example, include through-holes extending through the HDI PCBs and being filled with a thermal conductive material, such as copper. Another heat dissipation structure may be a grate provided at the upper or lower surface of the HDI PCB. Also the holes of the grate structure are filled with a thermal conductive material, such as copper. Accordingly, the manufacturing process of the HDI PCB may also take into account the filling of such heat dissipation structure with copper.

Conventional mSAP sequences start with a copper clad substrate, wherein the copper cover layers may be 3 to 9 μm thick and the substrate includes single- or double-sided blind microvias (BMV). The first step of the process is an electroless deposition of copper, distributing a thin metal seed layer (0.35 to 0.6 μm) on the peripheral surface of the copper clad substrate and the inner surface of the microvia in order to provide a conductive base for the subsequent electrodeposition step. Subsequent electrodeposition of ~3 μm flash copper constitutes the first copper layer and results in partially filled microvias. Laminating a patterned dry film (mask) in the next step defines the negative of the line pattern (conductive traces); i.e. the patterned dry film defines the spacing areas between the conductive traces of the final PCB. In the following step, the substrate is processed in a second electrodeposition step using specific microvia-filling electrolytes. Subsequent removing of the dry film, however, reveals that the use of such specific electrolytes in the previous step will yield in unfavourable copper thickness variations between the microvia pad (outer end of the microvia) and the patterned copper surfaces, which in turn results in difficulties in the subsequent etching step. At last, the trace to trace separation will be realized by complete etching of the first and second copper layer as well as the seed and cover layer in the areas previously defined by the dry film.

As the US separation decreases due to constant demand of ever decreasing trace width, the removal of the excess copper becomes an increasingly complex problem. Since there has always been a tendency to "over etch" in order to accommodate plated copper thickness variations and ensure a clean trace to trace separation, with traces <30 μm in width there is serious risk of unacceptable width reduction as well as undercut. In consequence, a reduction of the layer thickness of the copper layers as well as decreased thickness variations is a desirable object of the present invention in order to reduce the mentioned risks during the etching process. These problems naturally also arise in the event that heat dissipation structures, such as through-holes or grate structures, are filled with copper.

Furthermore, substrate surface areas with varying degree of perforation are characterized by the high hole density (HHD) surface factor. The HHD surface factor is defined as ratio between the total surface including the inner surfaces of e.g. all vias and/or grate structures (also called total grid area or total grid surface) and the peripheral surface of the corresponding area (also called grid area or grid surface), wherein the HDD surface factor is 1 of no via or other structures exist. The calculation of inner surface will be affected by the diameter of the vias and grate structures, the distance of the vias to each other, the number of the vias within a certain area and the thickness of the substrate. The higher the HHD surface factor, the more vias, respectively, the smaller the hole pitch (distance between via-midpoints), the smaller the diameter of the via and the bigger thickness of the substrate, e.g. board, through which the vias and grate structure expand. The grate structures may be important heat dissipation elements for an efficient temperature regulation of the HDI PCB. However, grate structures constitute also areas with high HHD factors due to a very close wall-to-wall arrangement of multiple slots, respectively, due to very small wall-to-wall distances.

The HHD surface factor determines the resulting local current density in case of an applied voltage, i.e. the higher the HHD surface factor, the lower current density. As a consequence for electrochemical depositing processes this means that different material conditions (varying local current densities) will result in varying layer thicknesses. However, layer thickness variations will lead to subsequent etching (levelling) issues and may even cause reduced layer adhesion in the stacked PCB-substrate. If the variation in the resulting layer thickness after filling is too high compared with the complexity of the surface of the substrate (areas with high and low HHD surface factors), subsequent process steps cannot be performed and the substrate will be rejected by the customer.

In this context the filling of microvias, through-holes and/or grate structures having high HHD surface factors or also the combined filling of microvias, through-holes and/or grate structures having different HHD surface factors is particularly challenging.

In the state of the art various processes for filling through-holes are described.

For instance, US 2007/0163887 A1 describes a method of manufacturing a circuit carrier comprising, after providing a printed circuit board, coating the circuit board on at least one side thereof with a dielectric, structuring the dielectric for producing trenches and vias therein using laser ablation. Next, a primer layer is deposited onto the dielectric, either onto the entire surface thereof or into the produced trenches and vias only. A metal layer is deposited onto the primer layer, with the trenches and vias being completely filled with metal for forming conductor structures therein. Finally, the excess metal and the primer layer are removed until the dielectric is exposed if the primer layer was deposited onto the entire surface thereof, with the conductor structures remaining intact.

However, by using the subtractive method a very unequal copper surface distribution between areas having trenches and vias and areas without such structures is formed. This differences cannot be removed e.g. by etching because all areas will be etched in the same way wherein the differences of the surface heights would not disappear. Therefore this method is not suitable for HDI PCB production with areas of high HHD surface factors. Also by using the additive method a strong overplating in the areas having the trenches and vias occurs while complete filling with metal. This metal has to be removed later.

For example by using prior art subtractive method, a substrate surface area having a HHD surface factor of 1 under the given conditions, a metal plating thickness of 10 μm could be achieved. Under the same conditions plating (completely filling) a substrate surface area A having a HHD surface factor of 1 and adjacent substrate surface area B having a HHD surface factor of 1.2, the achievable metal plating thickness in area A is again 10 μm, while at the same time the achievable metal thickness of substrate surface area B is only 8.3 μm because of the 17% higher total grid surface. These different heights of the copper surface in the different surface areas leads in this example to a difference in height (or plating thickness) of 1.7 μm or 17%. As a further example a HHD surface factor of 3 would lead in this example to 3.3 μm thickness in area B and to a difference in height of 6.7 μm or 67%. Such surface thickness differences on the surface of the substrate cannot or cannot be easily equalized later on. Therefore the method is not suitable to be applied in the field of HHD surface plating.

WO 2006/032346 A1 describes a two-step deposition technique which first provides two holes from the through-hole by completely or almost completely filling the hole center, thereby creating blind vias, which are each closed at one end close to the hole center. The shape of the deposit in the area of the through-hole center was adjusted by an increased scattering in the area of the through-hole center providing V-shaped or rounded narrow part deposits. The subsequent process for filling blind vias is also known and described in the state of the art.

One example may be EP 1 264 918 A1 that describes an electrolytic copper deposition process which is particularly suitable for filing micro blind vias. Here, the use of inert anodes in a dummy plating phase helps to maintain and improve the filling-ability of the electrolyte.

However, the efficiency of both steps depends on the full adjustability of the (reverse) current pulse, which is applied in these electrochemical processes as driving force for the metal deposition. Since metal base layers (seed layer) serve as cathode in these redox systems, evidently the material characteristics constitute a significant factor (e.g. conductivity, melting point). Typically, a seed layer is made of copper and is formed by electroless depositing. The disadvantage of such electroless copper seed layers lies in the low etching-resistance causing issues, in particular, when high current pulses parameters will be applied to allow lower current efficiencies. Further, copper seed layers may also be unsuitable due to physical properties such as the melting point, in particular, when high current densities are applied in order to increase the throughput during the filling process.

It is thus an object of the present invention to overcome or reduce at least one of the abovementioned disadvantages as described in the following.

SUMMARY OF INVENTION

The present invention refers to a method of preparing a high density interconnect printed circuit board (HDI PCB) or IC substrates including through-holes and/or grate structures filled with copper as defined in claim 1. The method comprises the steps of:

a) providing a multi-layer substrate comprising
    (i) an insulating core layer having a peripheral surface, or
    (i') a stack assembly of an insulating core layer embedded between two electrically conductive interlayers and at least one outer insulating layer attached on the electrically conductive interlayer and having a peripheral surface,
    (ii) an optional cover layer, preferably made of copper, and covering the peripheral surface, and
    (iii) at least one through-hole extending through all layers of the multilayer substrate; and/or
    a grate structure having multiple slots extending through the optional cover layer and partially extending in the insulating core layer or extending through at least the optional cover layer and at least one of the outer insulating layers;

b) forming a non-copper conductive layer or a copper layer on the cover layer and on an inner surface of the through-hole, respectively on an inner surface of the grate structure;

c) forming a patterned masking film on the non-copper conductive layer or on the copper layer;

d) electrodepositing a copper inner-seal inside the through-hole sufficient to form two blind-microvias, respectively electrodepositing a copper inlay on the non-copper conductive layer or on the copper layer of the inner surface of the grate structure and on the remaining peripheral surface of the non-copper conductive layer or of the copper layer, all in one step;

e) removing the masking film; and f) electrodepositing a copper filling in the blind-microvias, respectively the copper inlay, and on the first copper layer in one step.

The electrodepositing of step d) is preferably performed by reverse pulse plating.

The electrodepositing of step f) is preferably performed by using a redox system having e.g. a source of $Fe^{2+}$ and/or $Fe^{3+}$ ions and/or other suitable redox pairs as $V^{4+}$ and/or $V^{5+}$ ions. The plating can be performed as reverse pulse plating, pulse plating or DC plating, preferred as reverse pulse plating.

According to another aspect of the present invention, a high density interconnect printed circuit board (HDI PCB) or IC substrates including through-holes filled with copper is provided, wherein the HDI PCB is obtained by the method described above.

Further aspects of the present invention could be learned from the dependent claims or the following description.

The expression "through hole and/or grate structures" and "area of structures of through holes and/or grate structures" are considered as interchangeable in the following description.

With the present invention it is in particular possible to fill structures as through-hole and/or grate structures which can be defined as an area of structures of through-hole and/or grate structures with high HHD surface factors. As higher the HHD surface factor is as more advantageously is the use of the invention. The HHD surface factors are preferred in the range from 1.1 to 5, more preferred 1.1 to 3, and most preferred 1.1 to 2.

Also it is possible to fill areas having structures of through holes and/or grate structures with high HHD surface factors, preferred from 1.1 to 5, more preferred 1.1 to 3, most preferred 1.1 to 2, and at the same time to plate areas having HHD surface factors of 1 on the surface of the substrate.

The HHD surface factor used in the present invention was calculated as follows:

$$HDD\ surface\ factor = total\ grid\ area/grid\ area.$$

FIG. 6A, 6B, and 6C illustrate grids showing through-holes arranged on a grid surface. The total grid area (also total grid surface) includes the surface of an area in which are the through-holes (or at least one through-hole) are located and the surface of the walls of the through holes (depending on the number, the diameter and the thickness of the substrate e.g. board). Thus, the dimension of the surface is affected by the wall to wall distance between the through-holes, the hole pitch (distance from two adjacent centers of two through-hole, the number and the diameter of the through-holes, and the thickness of the board. Around the area of the at least one through-hole a frame area is located, which also belongs to the total grid area (see FIG. 6A). The circumference of at least one through-hole or a part of the circumference of the outermost through-holes of a certain number of through-holes are directly adjacent to the frame area. While the wall to wall distance between the through-holes, the number and the diameter of the through-holes can vary, the dimension of the frame of the frame area is fixed for calculation of the HHD surface factor to 1 mm width (see FIG. 6B).

The grid area (also grid surface) includes the theoretical surface of the area in which are the through-holes (or at least one through-hole) would be located, but calculated without the at least one through-hole. Around the area, having the theoretical surface the same frame area (as in the total grid area) is located, which also belongs to the grid area (see FIG. 6C).

As a practical example to get a HHD surface factor of 1.76 the following parameters are given:
Grid 5×5 trough-holes
Board thickness 1.5 mm
Hole diameter 0.2 mm
Hole pitch 0.4 mm
wall to wall 0.2 mm
frame width 1 mm
total grid surface 40.8 mm$^2$
grid area 28.8 mm$^2$ An area with through-holes has preferred from 400 to 20'000 holes, a hole pitch from 0.05 to 2.0 mm, a hole diameter from 0.05 to 2.0 mm, a board thickness from 0.2 to 3.2 mm.

After copper filling step f) the difference of the heights of the resulting copper plating thickness over the through hole and/or grate structure is from 0 to 40% compared to a height having no through hole and/or grate structure. The substrate may also include areas without through holes or grate structures and areas of structures of through holes and/or grate structures.

The resulting copper plating thickness of the copper filling step f) in view of the heights over the through hole and/or grate structure or respectively in view of the heights in different areas shall be equally distributed, wherein the difference of the heights of areas having different HHD surface factors is from 0 to 40% of the copper plating thickness, preferred from 0 to 20%.

In one embodiment of the present invention a substrate including only areas with through-holes having higher HHD surface factors e.g. from 2 to 5 and areas having HHD surface factors of 1 on the surface of the substrate can be filed wherein the difference of the heights of areas is from 0 to 20%.

In one embodiment of the present invention a substrate including areas with through-holes and/or grate structures having different HHD surface factors e.g. from 1.1 to 5 and areas having HHD surface factors of 1 on the surface of the substrate can be filed wherein the difference of the heights of areas is from 0 to 40%. The more complex the surface of a substrate is, the more tolerable is the admissible difference of the heights of the different areas.

Furthermore with the inventive method a very even and comparable thin and even copper surface layers over the filled structures of through hole and/or grate structures or areas of through holes and/or grate structures can be provided. This prevents or reduces an etching or polishing step after step f).

BRIEF DESCRIPTION OF THE DRAWINGS

Features will become apparent to those of ordinary skill in the art by describing in detail exemplary embodiments with reference to the attached drawings in which.

DETAILED DESCRIPTION OF THE INVENTION

Figure 1:
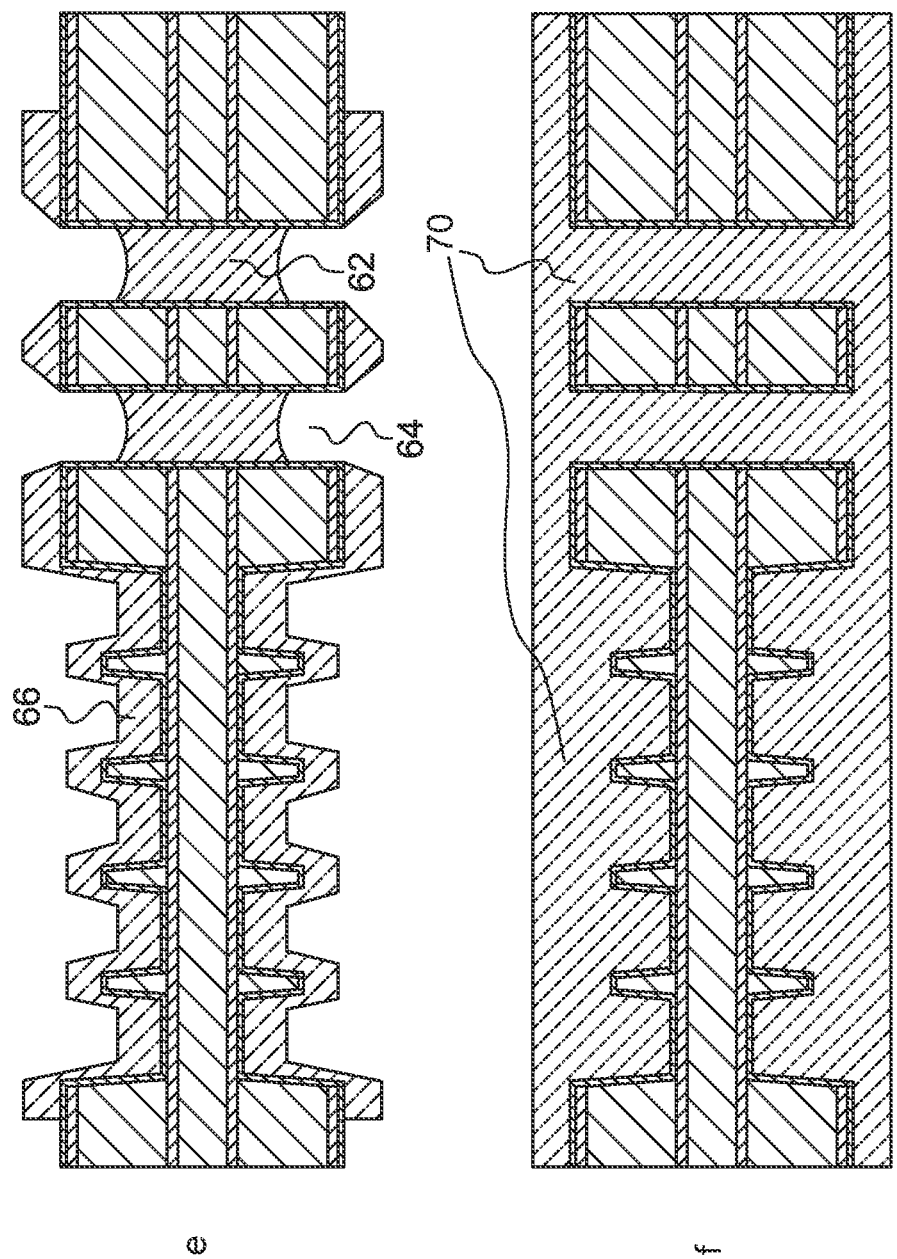
FIG. 1 illustrates a schematic sequence including cross sectional views of each step a) to f) of the method according to an embodiment of the present invention.

Reference will now be made in detail to embodiments, examples of which are illustrated in the accompanying drawings. Effects and features of the exemplary embodiments, and implementation methods thereof will be described with reference to the accompanying drawings. In the drawings, like reference numerals denote like elements, and redundant descriptions are omitted. As used herein, the term "and/or" includes any and all combinations of one or more of the associated listed items. Further, the use of "may" when describing embodiments of the present invention refers to "one or more embodiments of the present invention".

In the following description of embodiments of the present invention, the terms of a singular form may include plural forms unless the context clearly indicates otherwise.

In the drawings, the sizes of elements may be exaggerated for clarity. For example, in the drawings, the size or thickness of each element may be arbitrarily shown for illustrative purposes, and thus the embodiments of the present invention should not be construed as being limited thereto.

Features of the inventive concept and methods of accomplishing the same may be understood more readily by reference to the following detailed description of embodiments and the accompanying drawings. Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present disclosure may not be described.

As used herein, the term "substantially," "about," and similar terms are used as terms of approximation and not as terms of degree, and are intended to account for the inherent deviations in measured or calculated values that would be recognized by those of ordinary skill in the art. Further, if the term "substantially" is used in combination with a feature that could be expressed using a numeric value, the term "substantially" denotes a range of +/−5% of the value centered on the value. Further, the use of "may" when describing embodiments of the present invention refers to "one or more embodiments of the present invention." Herein, the terms "upper" and "lower" are defined according to the z-axis. For example, the cover is positioned at the upper part of the z-axis, whereas the ground plate is positioned at the lower part thereof.

As used herein, the term "copper plating thickness" or "height" refers to the thickness of a deposited/plated copper layer in step f). The thickness of the copper layer or their height can be different if the layer is deposited to fill through holes and/or grate structures which are located within the surface of a substrate. Therefore the given values of the thickness of the copper layer or the height are calculated starting from the surface of the substrate (including the conformal layers of the foregoing steps) which does not contain through holes or grate structures (HHD surface factor 1) or calculating from the surface of the substrate where through holes or grate structure starts to extend into the substrate (HHD surface factor >1). Both "surfaces" are on the same level. The resulting thickness of the copper filling of step f) leads to a comparable thin and even copper layer thickness over the through hole and/or grate structure or the area of through holes and/or grate structures (with HHD surface factor >1.1, more preferred 1.1 to 5) preferred from 10 to 300 µm, more preferred from 10 to 100 µm, even more preferred 10 to 30 µm. "Comparable" in this context means, that as longer the through-holes (or as thicker the thickness of a substrate like a board) as thicker the first copper layer might be.

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate as IC substrates. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present invention.

In general, HDI PCBs offer the finest trace structures, the smallest holes and blind and buried vias (microvias). HDI technology thus allows a highly compact, reliable PCB design to be achieved using via-in-pads and multiple microvia layers (stacked and staggered vias). By pressing further layers using SBU (Sequential Build Up) or SSBU (Semi Sequential Build Up) technology, signals on the conductive interlayers can be connected and unbundled. This leaves space on the outer layers for components with a high pin density. IPC standards define HDI circuit boards by means of microvias 0.15 mm and track width/distance≤0.1 mm.

The HDI layers may be built up from a double-sided core board or multilayer PCB. The HDI layers may be built on both sides of the PCB. The SBU/SSBU process consists of several steps: layer lamination, via formation, via metallization, and via filling. There are multiple choices of materials and/or technologies for each step. In particular, microvias can be filled with different materials and processes. However, stacked microvias are usually filled with electroplated copper to make electrical interconnections between multiple HDI layers and provide structural support for the outer levels of the microvias or for a component mounted on the outermost copper pad.

Furthermore, HDI PCBs may include heat dissipation structures, such as through-holes or grate structures filled with copper. The present invention refers to a manufacturing sequence where through-holes and/or grate structures are filled with copper.

The invention may be used for building IC substrates. IC substrates serve as the connection between IC chip(s) and the PCB through a conductive network of traces and holes. IC substrates support critical functions including circuit support and protection, heat dissipation, and signal and power distribution. IC substrates represent the highest level of miniaturization in PCB manufacturing and shares many similarities with semiconductor manufacturing. The inventive method of preparing a high density interconnect printed circuit board (HDI PCB) or IC substrates including through-holes and/or grate structures filled with copper will now be explained in detail with reference to the exemplary embodiments illustrated in FIGS. 1 through 5.

FIG. 1 shows a schematic sequence including cross sectional views of each step a) to f) of the method, wherein the HDI PCB includes through-holes 20 as well as a grate structure 30, which have to be filled with copper. Details of the sequence will be explained below.

Figure 2:
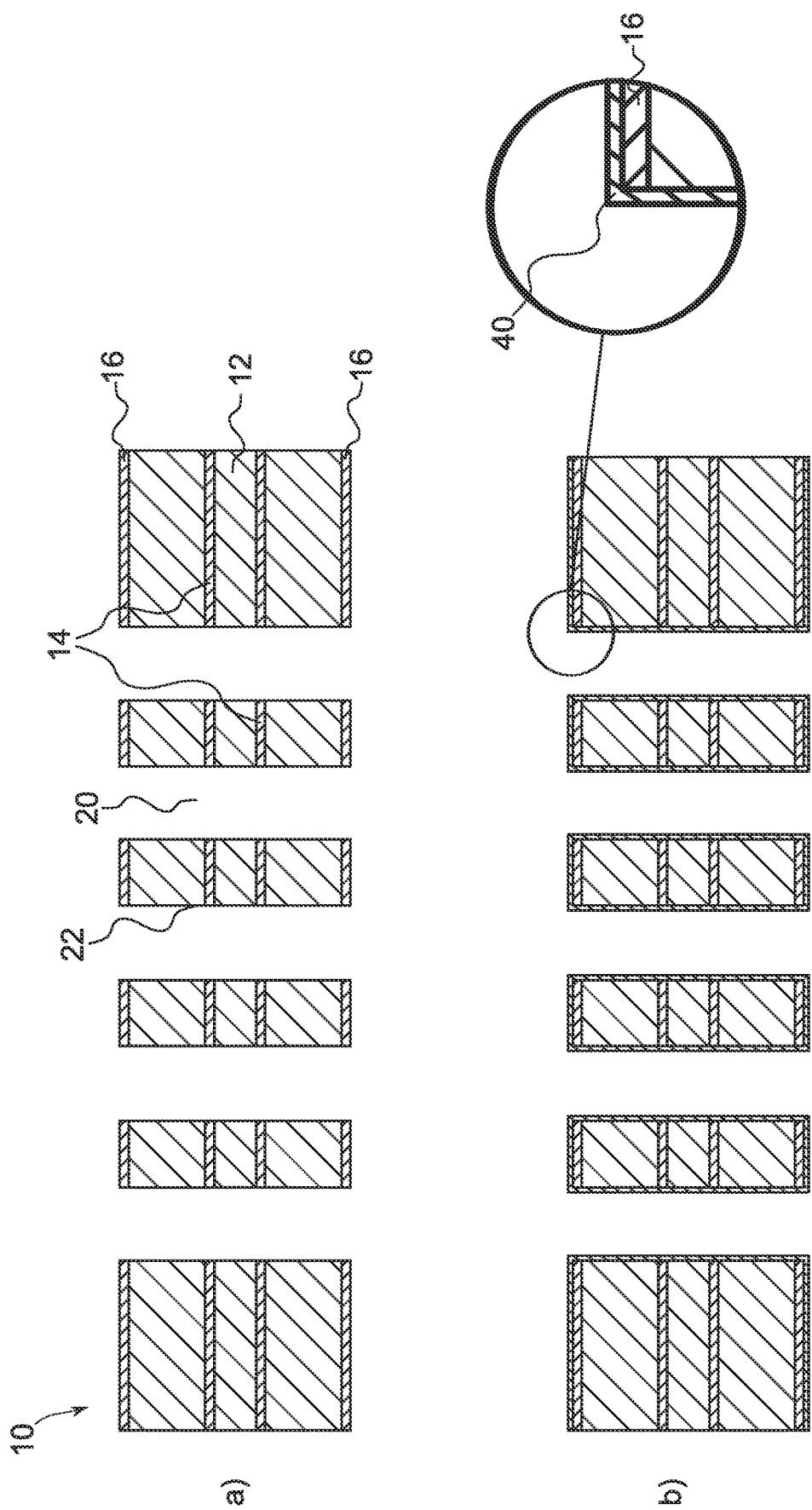
FIG. 2 illustrates a schematic sequence including cross sectional views of each step a) to f) of the method according to another embodiment of the present invention.
Figure 2:
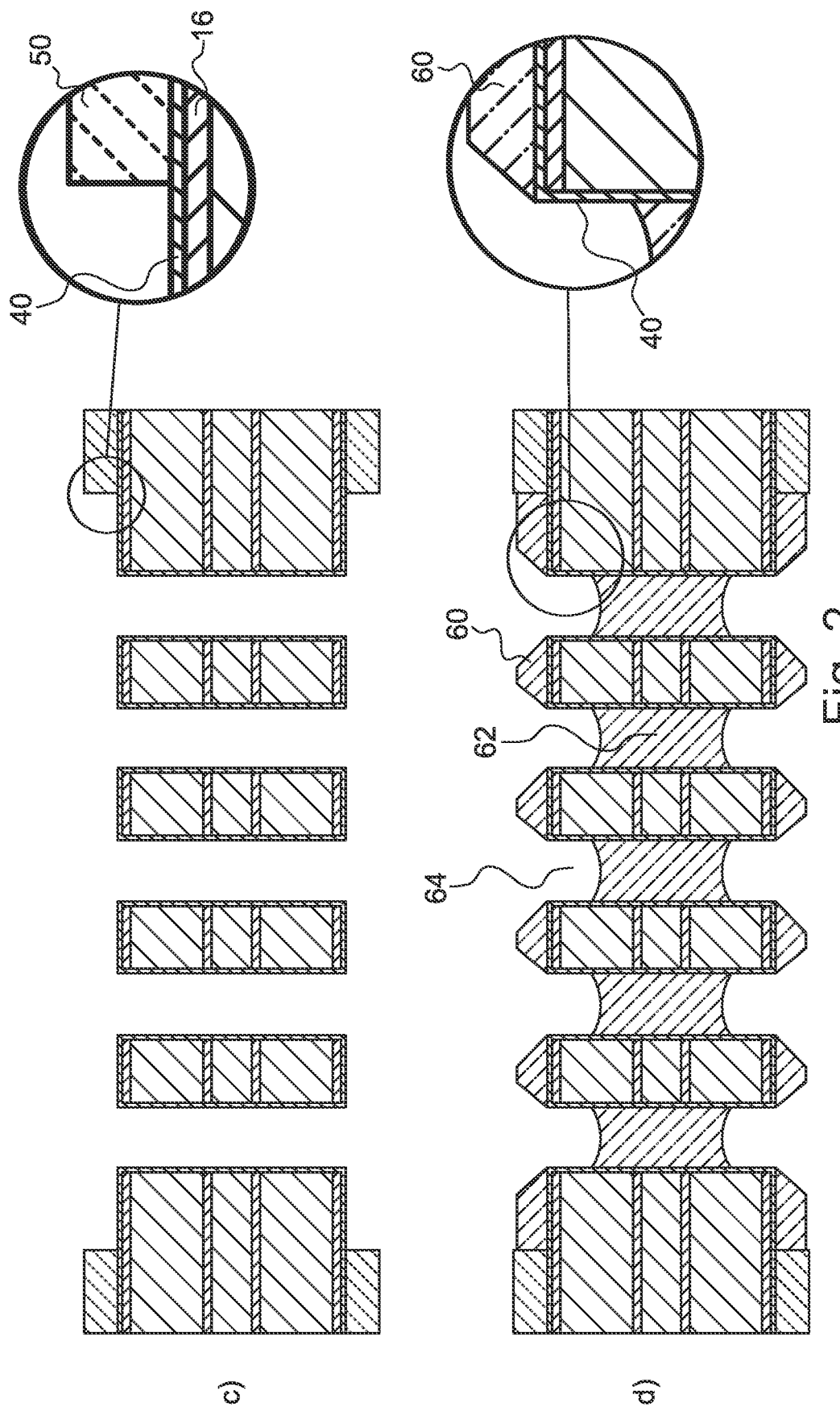
Figure 2:
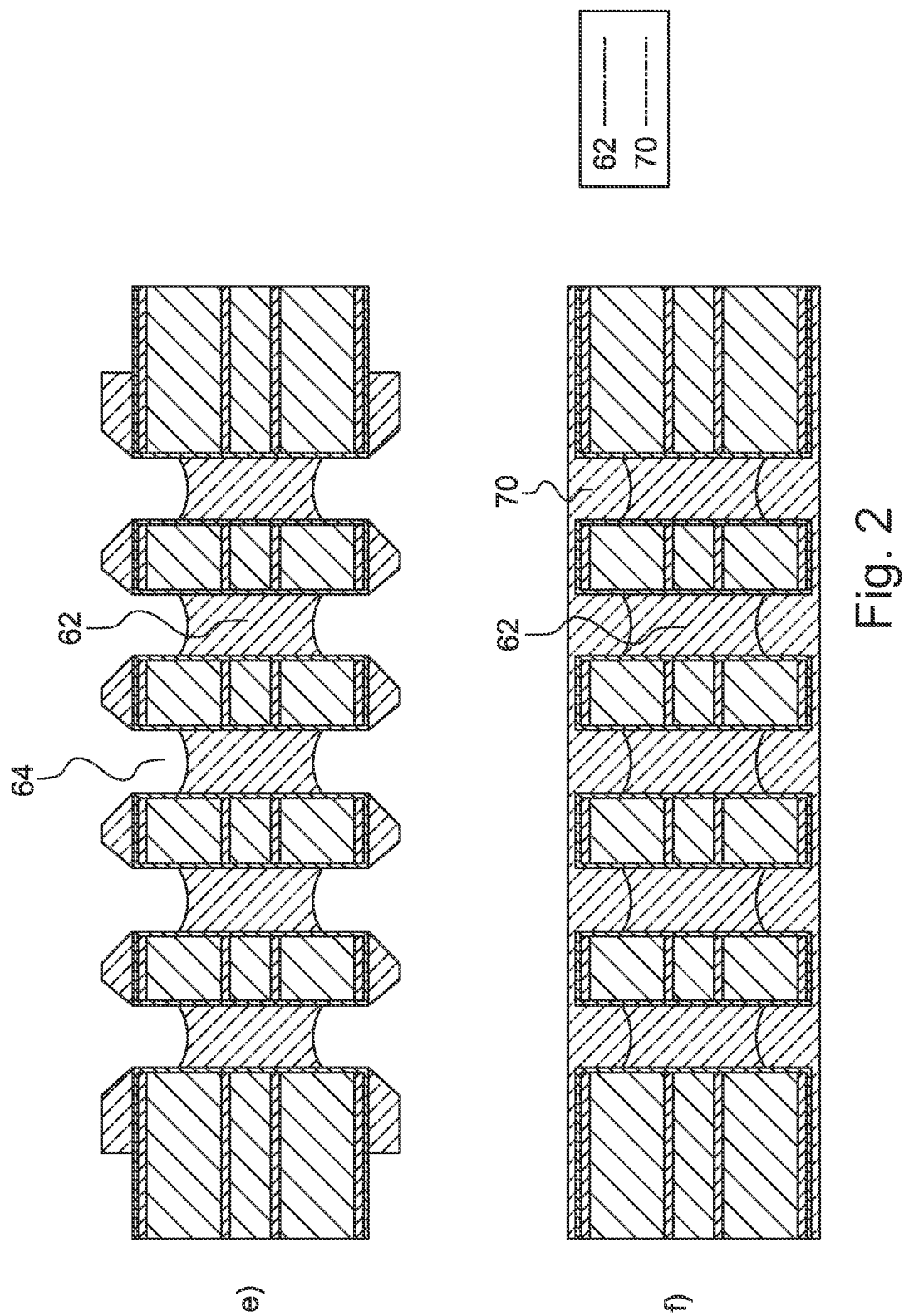
Figure 3:
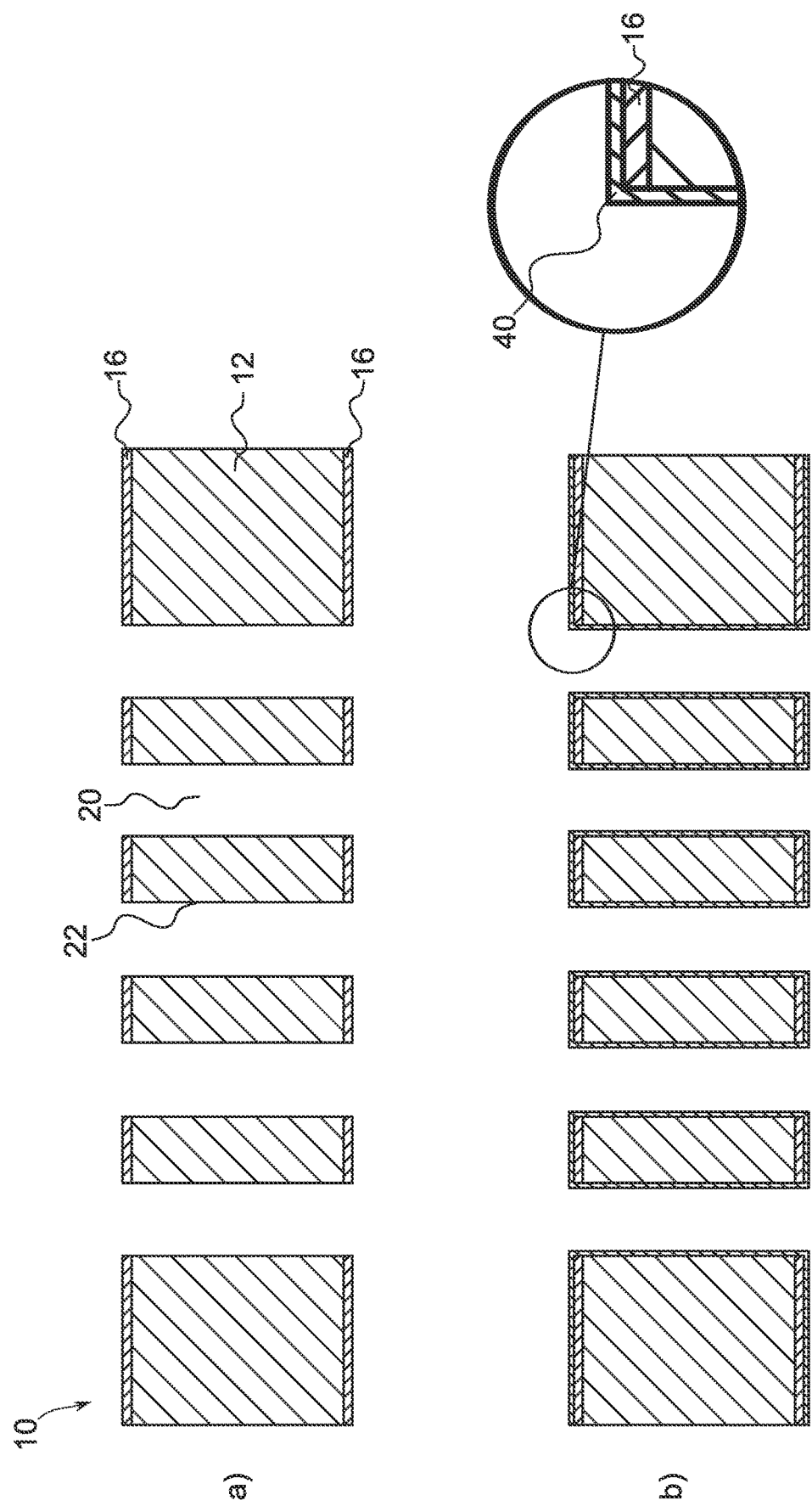
FIG. 3 illustrates a schematic sequence including cross sectional views of each step a) to f) of the method according to a further embodiment of the present invention.
Figure 3:
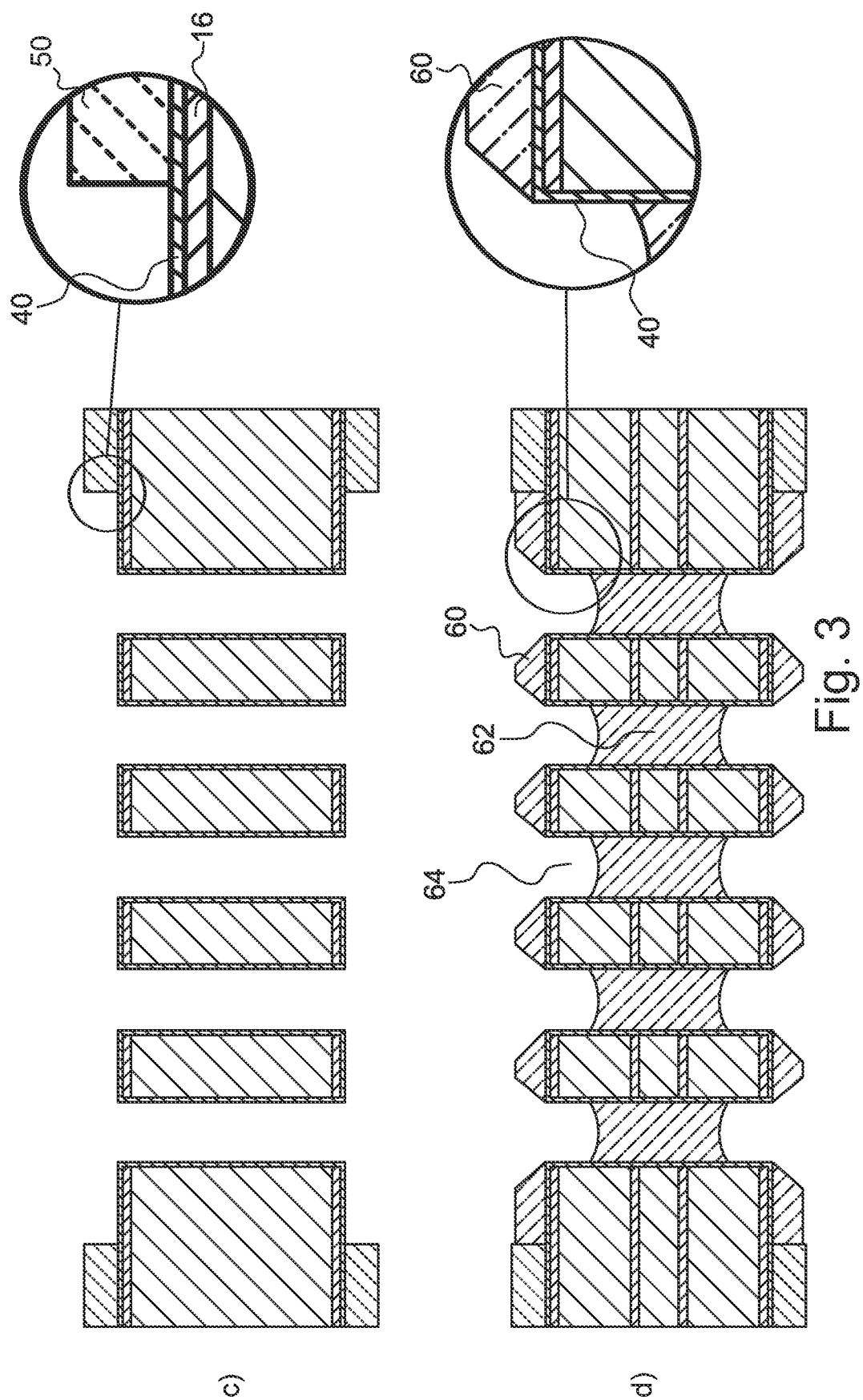
Figure 3:
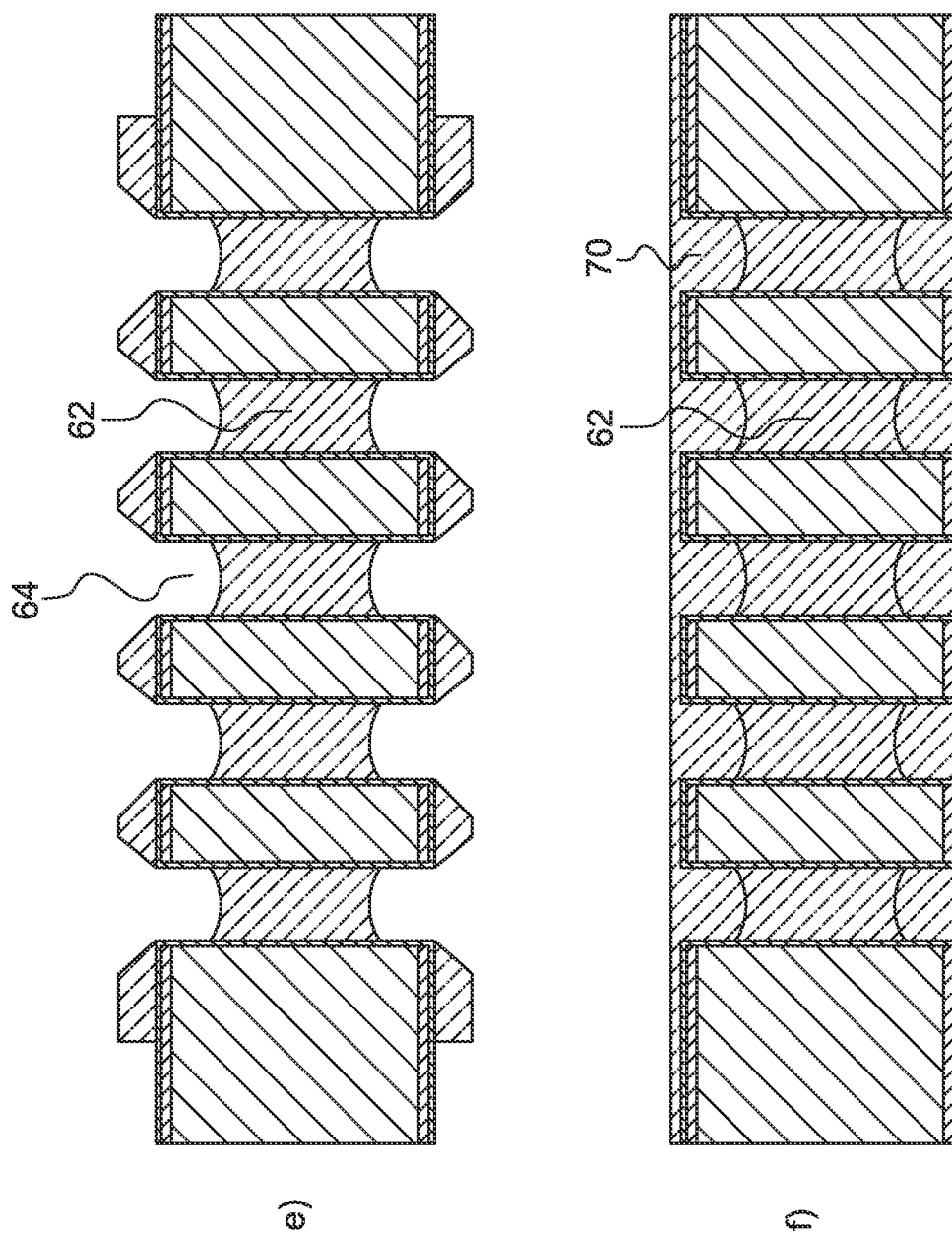

FIG. 2 and FIG. 3 illustrate a further schematic sequences including cross sectional views of each step a) to f) of the method when the HDI PCB includes through-holes 20. In the embodiment of FIG. 2, a stack assembly comprises an insulating core layer 12 embedded between two electrically conductive interlayers 14. At least one outer insulating layer 13 is attached on the electrically conductive interlayer 14. In the embodiment of FIG. 3, the through-holes 20 are provided in an area of the HDI PCB without any conductive interlayers. Again, details of the sequence will be explained below.

Figure 4A:
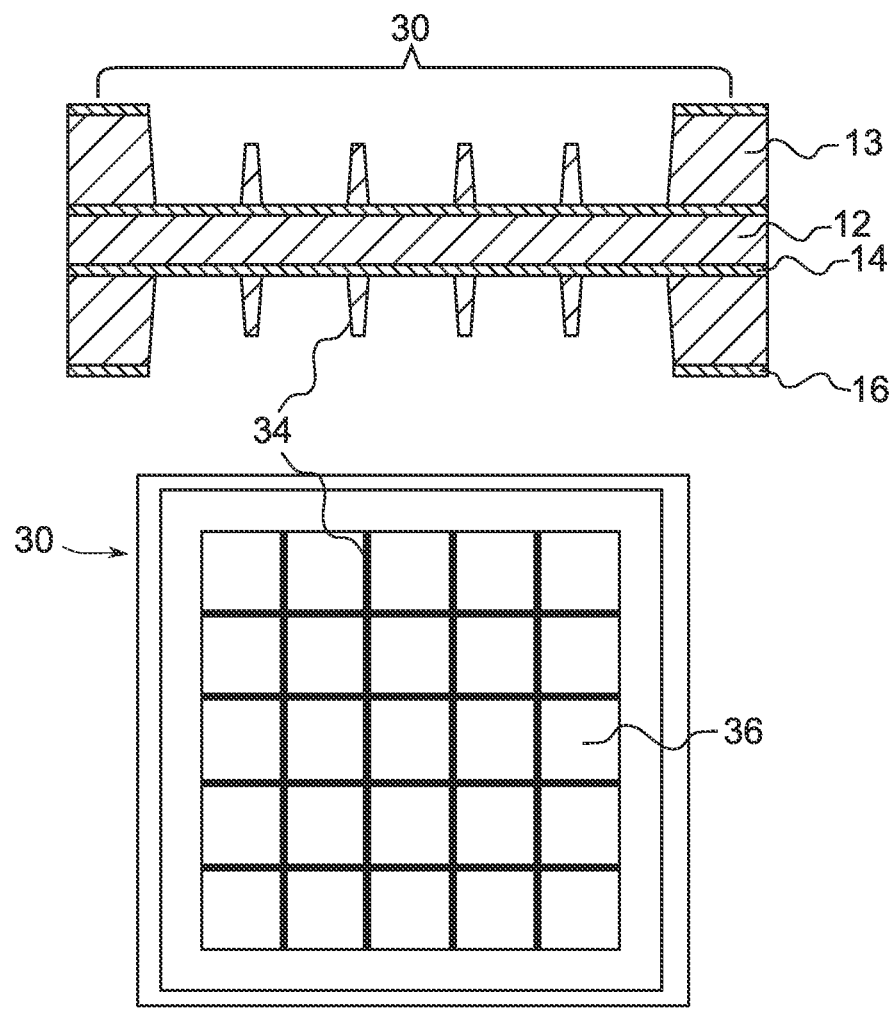
FIG. 4a, 4b illustrate schematic cross sectional views and respective schematic top views of a grate structure according to a first embodiment and a grate structure according to a second embodiment.
Figure 4B:
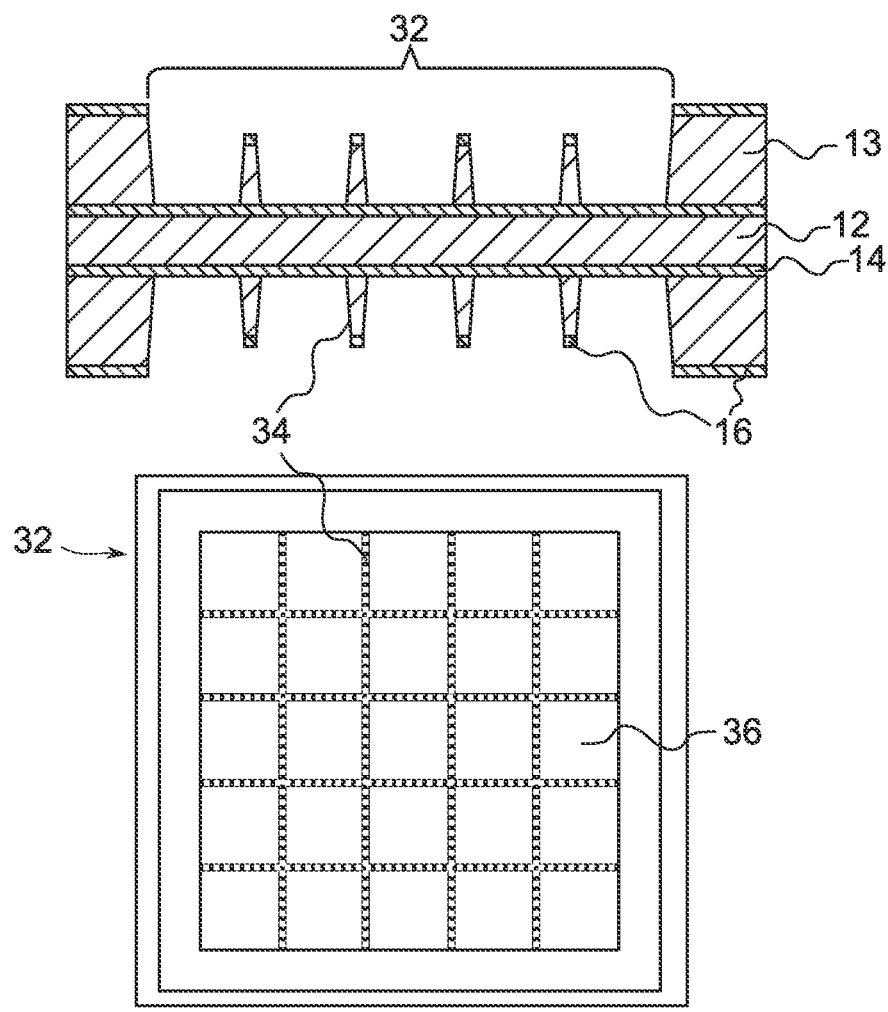

FIGS. 4a and 4b illustrate schematic cross sectional views and respective schematic top views of two exemplary grate structures 30, 32.

According to the first embodiment, which is illustrated in FIG. 4a, a grate structure 30 is provided on both sides of the HDI PCB. The grate structure 30 includes twenty-five slots 36 being arranged in five rows and columns. The slots 36 are separated by thin walls 34. The dimensions of each of the slots 36 may be in the same as of the through-holes 20. The slots 36 extend through the cover layer 16 and the outer insulating layers 13. The walls 32 have a height which is less than the thickness of the insulating layer 13.

According to the second embodiment, which is illustrated in FIG. 4b, the grate structure 32 is distinguished form the grate structure 30 of FIG. 4a in that the thin walls 35 extend to the same height as the insulation layers 13 and are covered by the cover layer 16.

Figure 5:
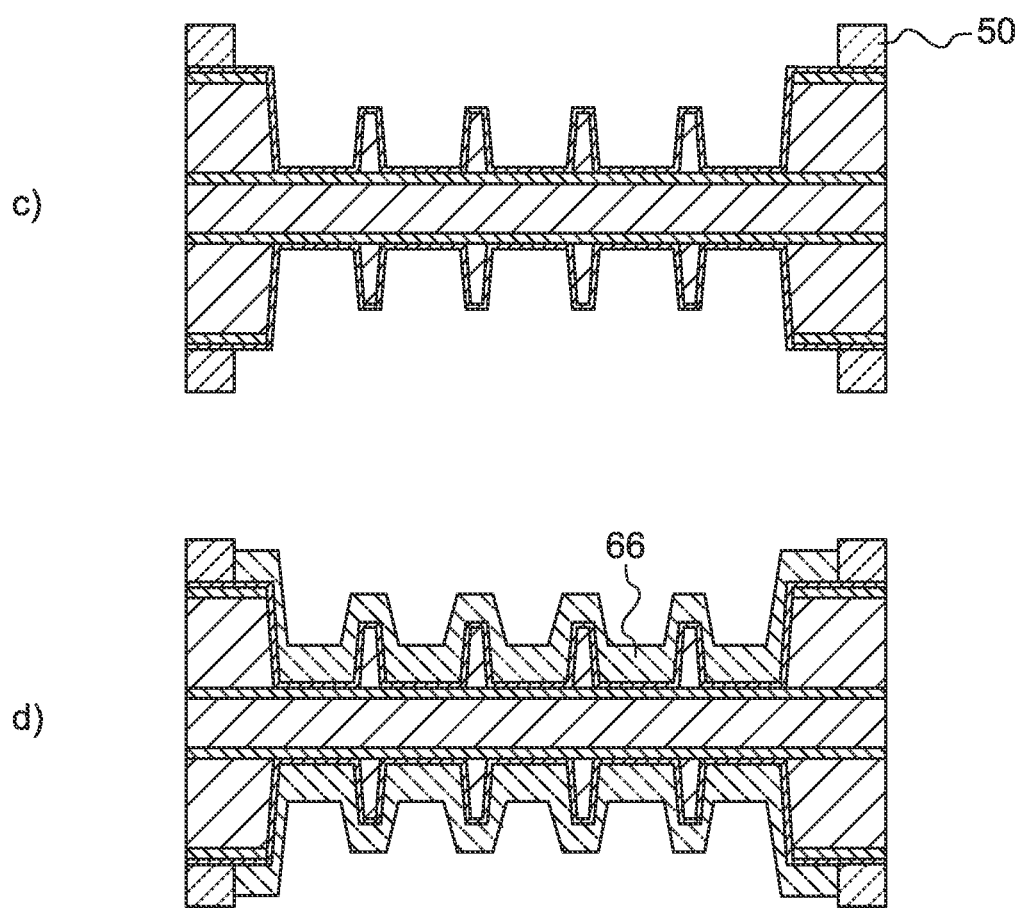
FIG. 5 illustrates a schematic sequence including cross sectional views of each step a) to f) of the method according to a further embodiment of the present invention.
Figure 5:
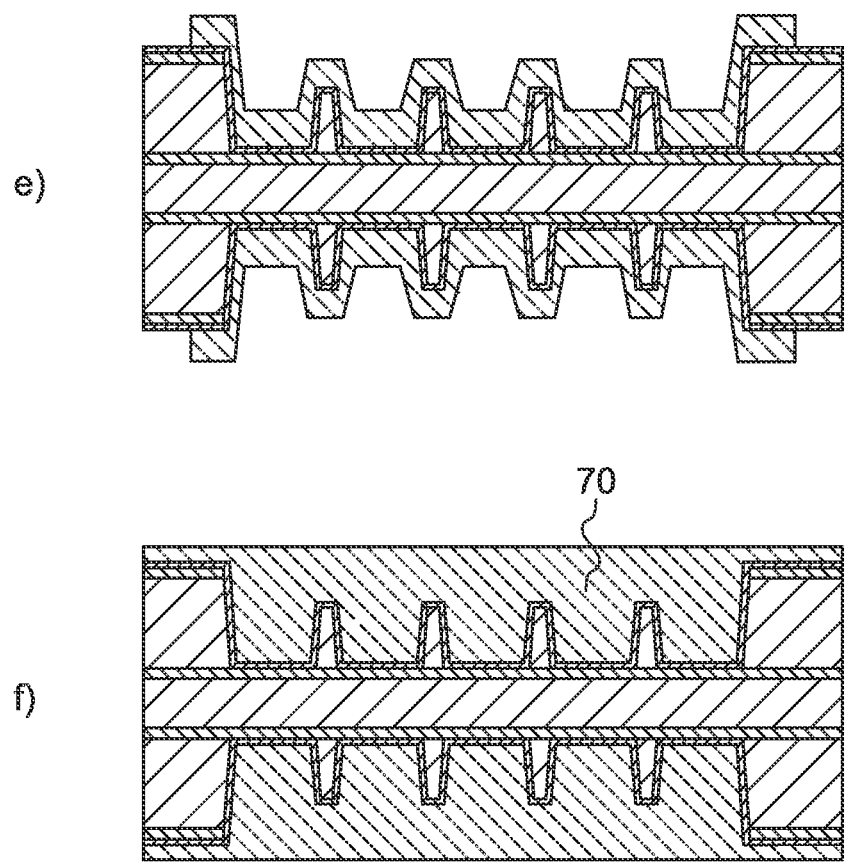
Figure 6:
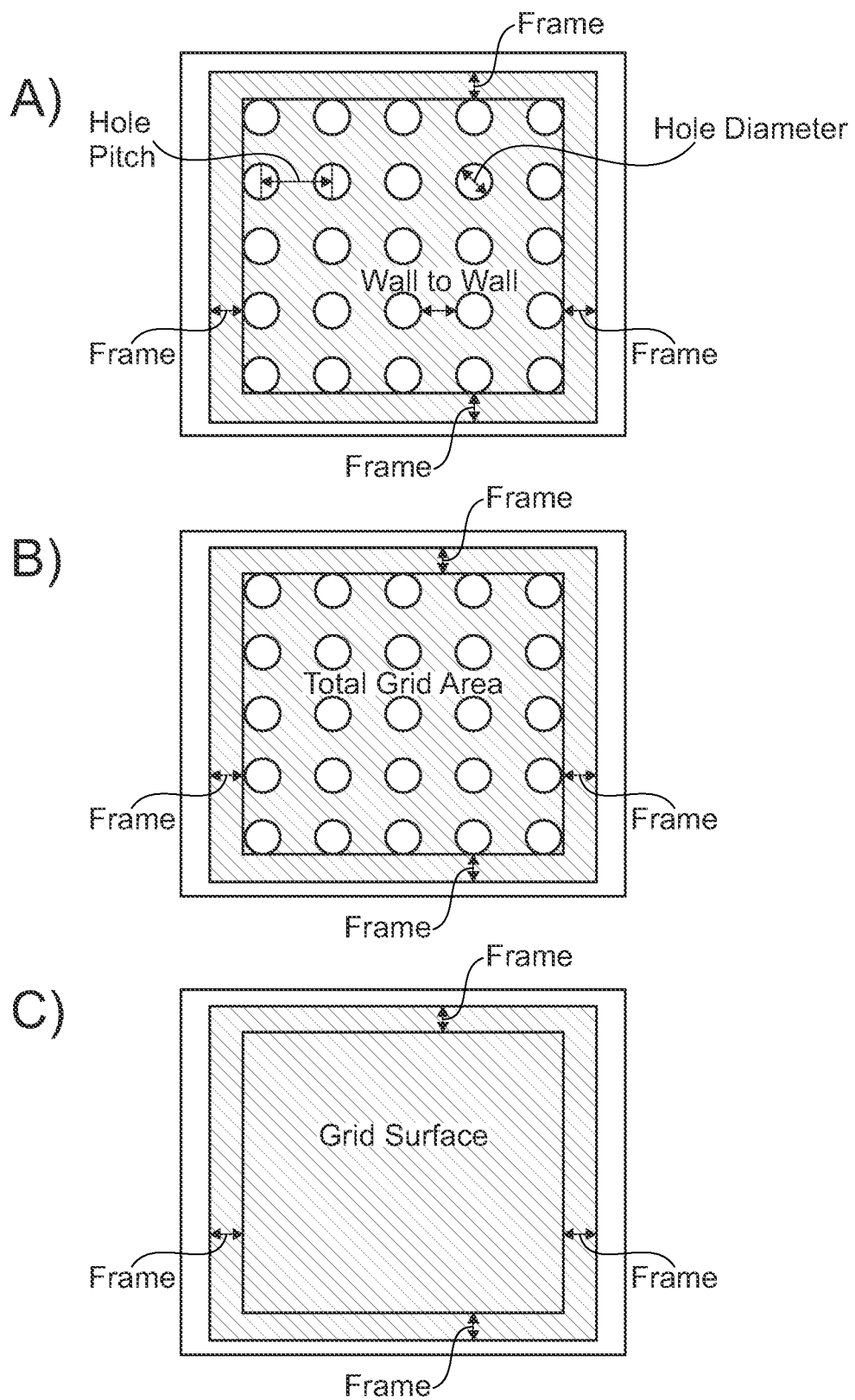
FIG. 6A, 6B, and 6C illustrate grids showing through-holes arranged on a grid surface.

FIG. 5 illustrates a schematic sequence including cross sectional views of each step a) to f) of the method in case of filling the grate structure 30 illustrated in FIG. 4a. The details of the sequence will be explained below.

The inventive method of preparing a high density interconnect printed circuit board (HDI PCB) or an IC substrate including through-holes 20 and/or grate structures 30, 32 filled with copper comprises the steps of:
a) providing a multi-layer substrate 10 comprising
   (i) an insulating core layer 12 having a peripheral surface, or
   (i') a stack assembly comprising an insulating core layer 12 embedded between two electrically conductive interlayers 14 and at least one outer insulating layer 13 attached on the electrically conductive interlayers 14 and having a peripheral surface,
   (ii) an optional cover layer 16, preferably made of copper, and covering the peripheral surface, and
   (iii) at least one through-hole 20 extending through all layers of the multi-layer substrate 10; and/or
   a grate structure 30, 32 having multiple slots 36 extending through the optional cover layer 16 and partially extending in the insulating core layer 12 or extending through at least the optional cover layer 16 and at least one of the outer insulating layers 13;
b) forming a non-copper conductive layer 40 or a copper layer 40 on the cover layer 16 and on an inner surface 22 of the through-hole 20, respectively on an inner surface of the grate structure 30, 32;
c) forming a patterned masking film 50 on the non-copper conductive layer 40 or on the copper layer 40;
d) electrodepositing a copper inner-seal 62 inside the through-hole 20 sufficient to form two blind-microvias 64, respectively electrodepositing a copper inlay 66 on the non-copper conductive layer 40 or a copper layer 40 of the inner surface of the grate structure 30, 32 and on the remaining peripheral surface of the non-copper conductive layer 40 or of the copper layer, in one step;
e) removing the masking film 50; and
f) electrodepositing a copper filling 70 in the blind-microvias 64, respectively the copper inlay 66, and on the first copper layer 60 in one step.

In other words, the manufacturing sequence starts in step a) by providing a multilayer substrate 10 comprising through-holes 20 and/or a grate structure 30, 32, wherein the multilayer substrate 10 may be laminated with a cover layer 16 on top of the outermost layer of the stack assembly. For HDI applications as mSAP a cover layer 16 is preferred. The outermost layer of the stack assembly may be the insulating core layer 12 or an outer insulating layer 13, which in turn is attached to an electrically conductive interlayer 14. At least one electrically conductive interlayer may be embedded between the insulating core layer and an outer insulating layer. Further, the electrically conductive interlayer may be embedded between two outer insulating layers as long as at least one electrically conductive interlayer may be embedded between the insulating core layer and an outer insulating layer. Preferably, the multilayer substrate 10 comprises both, through-holes 20 and the grate structure 30, 32.

According to one embodiment, the through-hole 20 has a diameter in a range from 30 μm to 1000 μm, and/or the multiple slots 36 have a diameter in a range from 30 μm to 300 μm.

The aspect ratio to diameter of the through-hole 20 versus thickness of the substrate 10 is 0.5 to 13, preferably 1 to 4. The aspect ratio to diameter of the multiple slots (36) versus depth of the slots is 0.5 to 3.

In step b), a non-copper conductive layer 40 or a copper layer 40 is formed on the cover layer 16 as well as on an inner surface 22 of the through-hole 20 and/or an inner surface of the grate structure 30, 32. For some applications e.g. IC-substrate applications as SAP processes with even more smaller line to space ratios preferably no cover layer 16 is applied. The non-copper conductive layer 40 of step b) may be a metal or alloy, a conductive metal oxide (such as titan oxide), a carbon-based material (such as graphite, graphyne, and graphdiyne), a conductive organic material as conductive polymers (such as Ecopact CP).

In cases where a copper layer 40 is formed, this layer is made of pure copper and is understood as copper layer including contents of copper 97 at. %, preferably ≥99 at. %, more preferably ≥99.5 at. %. This layer is preferably formed by wet chemical copper deposition, preferably after activation of the peripheral surface, especially if no cover layer 16 was formed.

In case of a metal or alloy, the term "non-copper" in the context of the non-copper conductive layer 40 may be understood as metal or alloy including contents of copper 95 at. %, preferably ≤50 at. %, more preferably ≤10 at. %, most preferred 1 at. %, as determined by standard chemical/instrumental analytical methods. ICP-MS (inductively coupled plasma mass spectrometry) may be used for analysis of copper traces in respective materials, which are used as non-copper conductive layer 40. In other words the non-copper conductive layer 40 is not made of pure or high purity copper. Preferably a non-copper conductive layer 40 is formed because the conditions and parameters in step d) can be chosen more aggressive, because copper-containing layer are more sensitive against to strong etching and/or undesired dissolving during electrodepositing in step d) of the present invention. With other words, the non-copper conductive layer 40 may be etch-resistant. In particular, the degree of etch resistance of the non-copper conductive layer

40 may be adjusted in order to prevent etching by the acids and/or electrolytes applied in the subsequent electrodeposition steps, but does not imply an absolute etch resistance.

The non-copper conductive layer 40 of step b) may be formed by one or more of an electroless plating process, an electroless deposition process, a physical deposition process, a chemical vapour deposition process, or a plasma-enhanced chemical vapour deposition process.

The application of a non-copper conductive layer 40 may enable to use high reverse pulse parameters with lower current efficiencies to perform inclusion free plating, but may also enable to use higher current densities for higher throughput during the through hole filling.

In step c), a patterned masking film 50 is formed on the non-copper conductive layer 40. The masking film 50 will be removed in step e).

In step d) and in case of a through-hole 20, a copper inner-seal 62 is formed inside the through-hole 20 by electrodeposition thereby forming two blind-microvias 64. In case of a grate structure 30, 32, a copper inlay 66 is formed on the non-copper conductive layer 40 of the inner surface of the grate structure 30, 32 by electrodeposition. In addition, a first copper layer 60 is formed on the remaining peripheral surface of the non-copper conductive layer 40. The process is performed in one step.

Step d) of electrodepositing the copper inner-seal 62 inside the through-hole 20, respectively the copper inlay 66 on the gate structure 30, 32, and electrodepositing a first copper layer 60 in one step may include immersing the multi-layer substrate 10 into an electrolytic bath in an electrolytic copper plating system with the non-copper conductive layer 40 connected as a cathode, the plating system further comprising an insoluble dimensionally stable anode and a source of copper metal, wherein the electrolytic bath comprises an acid, a source of copper ions, a source of ferrous and/or ferric ions, and at least one additive for controlling physical-mechanical properties of deposited copper.

Subsequent to the immersing step d) an electrical voltage between the insoluble dimensionally stable anode and the non-copper conductive layer 40 is applied, so that a current flows there between for a time sufficient to electrodeposit copper to form the copper inner-seal 62 and/or the copper inlay 66, as well as the first copper layer 60 on the peripheral non-copper conductive layer 40, wherein a $Fe^{2+}/Fe^{3+}$ redox system is established in the electrolytic bath to provide additional copper ions to be electrodeposited by dissolving copper ions from the source of copper metal. "One step" is defined here as one plater pass, i.e. the multilayer substrate is conveyorized once through the electrolytic copper plating system.

Step f) of electrodepositing the copper filling 70 in the blind-microvias 64 of the through-holes 20, on the copper inlay 66 and on the first copper layer 60 in one step may include immersing the multi-layer substrate 10 into an electrolytic bath in an electrolytic copper plating system with the non-copper conductive layer 40 connected as a cathode, the plating system further comprising an insoluble dimensionally stable anode and a source of copper metal, wherein the electrolytic bath comprises an acid, a source of copper ions, a source of ferrous and/or ferric ions, and at least one additive for controlling physical-mechanical properties of deposited copper.

Subsequent to the immersing step f) an electrical voltage between the insoluble dimensionally stable anode and the copper layer or the non-copper conductive layer 40 is applied, so that a current flows there between for a time sufficient to electrodeposit copper to form the copper filling 70 in the blind-microvia 64 and the copper inlay 66 while reducing the layer thickness of the first copper layer 60. A $Fe^{2+}/Fe^{3+}$ redox system is established in the electrolytic bath to provide additional copper ions to be electrodeposited by dissolving copper ions from the source of copper metal. "One step" is defined here as one plater pass, i.e. the multilayer substrate is conveyorized once through the electrolytic copper plating system. Reverse pulse plating is used for the electrodeposition of copper. In consequence a thin and even copper layer results from this step f).

The method comprising steps d), e) and f) constitutes a significant reduction of process steps, respectively, provides cost reduction and enables inclusion-free and dimple-free electrodeposition of copper. One objective problem of the present invention may therefore be to provide a method that allows time and cost efficient copper-filling for multilayer substrates comprising through holes and grate structures and consequently providing high quality PCBs with an improved thermal management of through holes.

With the present invention it is further possible to obtain a copper filling which provides an uniform copper surface of the copper plating thickness over the whole treated substrate without uneven heights in view of the filled structures as filled through-holes or filled grate structure in comparison with adjacent areas without the underlying filled structures e.g. areas directly adjacent or area between at least one through-hole and grate structures also comprising the copper made by step f).

The difference of the heights of the resulting copper layer of the areas of different HHD surface factors is from 0 to 40% of the copper plating thickness, preferred from 0 to 20% after step f).

Preferably the difference of the heights of the resulting copper layer is from 0 to 40% if the HDD surface factors are from 1.1 to 5. More preferred, the difference of the heights of the resulting copper layer is from 0 to 20% if the HDD surface factor is from 1.1 to 3 and/or the difference of the heights of the resulting copper layer is from 10 to 40% if the HDD surface factor is from 2 to 5.

In case, there are only two different HDD surface factors, HDD of 1.1-5 and 1, the difference can be from 0 to 10%. In case of more complex surfaces having areas with different at least three HDD surface factors 1.1-5 (including HHD surface factor of 1) the differences is 10-40%, preferred 10-30%.

Preferred is the difference of the heights of the resulting copper layer from 0 to 40% if the HDD surface factors for areas with through holes are from 1.1 to 5, more preferred from 1.1 to 3, most preferred from 1.1 to 2. Also preferred, the difference of the heights of the resulting copper layer is from 0 to 20% if the HDD surface factor is from 1.1 to 2. In case there only two different HDD surface factors, HDD of 1.1-2 and 1, the difference can be from 0 to 10%. In case of more complex surfaces have areas with three or more different HDD surface factors 1.1-5 (including HHD surface factor 1) the differences is from 10-40%, preferred 10-30%.

Preferred is the difference of the uneven heights of the resulting copper layer from 0 to 40% if the HDD surface factors for areas with grate structures are from 1.1 to 3, preferred from 1.1 to 2. More preferred, the difference of the heights of the resulting copper layer is from 0 to 20% if the HDD surface factor is from 1.1 to 2.

The acid in step d) and step f) may be selected from the group consisting of sulfuric acid, methane sulfonic acid, pyrophosphoric acid, fluoroboric acid and amidosulfuric acid.

According to one embodiment, the source of copper ions is a copper(II) salt, preferably selected from the group consisting of copper(II) sulfate, copper(II) sulfate pentahydrate, copper(II) sulfate heptahydrate, copper(II) methane sulfonate, copper(II) pyrophosphate, copper(II) fluoroborate, and copper(II) sulfamate.

As noted above, Fe(II) and/or Fe(III) salts are contained in the bath. Suitable iron salts may be both the iron(II)-sulfate-heptahydrate and iron(II)-sulfate-nonahydrate, from either or both of which the effective $Fe^{2+}/Fe^{3+}$ (Fe(II)/Fe(III)) redox system is formed after a short operational time.

According to another embodiment, the source of ferrous ions is a Fe(II) salt, preferably selected from the group consisting of iron(II) sulfate heptahydrate, iron(II) acetate, iron(II) propionate, iron(II) benzoate, and iron(II) hexafluorosilicates.

In one embodiment, the source of ferric ions comprises Fe(III) salts, preferably selected from the group consisting of iron(III) sulfate nonahydrate, iron(III) acetate, iron(III) propionate, iron(III) benzoate, and iron(III) hexafluorosilicates.

These salts are mainly suitable for aqueous, acidic copper baths. Other water-soluble iron salts may also be used, for example iron perchlorate. Salts which contain no (hard) complex formers are advantageous. Such complex formers may be biologically non-degradable or only may be degradable with some difficulty, thus such salts may create problems when disposing off-rinsing water (for example iron ammonium alum). Iron compounds having anions which lead to undesirable secondary reactions in the case of the copper deposition solution, such as chloride or nitrate for example, should not be used. In consequence, carboxylates of iron ions, such as acetate, propionate and benzoate, as well as the hexafluorosilicates, are also advantageous. Suitable systems employing the $Fe^{2+}/Fe^{3+}$ redox system are disclosed, for example, in WO 2010/094998 A1, WO 2007/112971 A2, U.S. Pat. Nos. 5,976,341 and 6,099,711, which may be consulted for additional details on this system. The disclosures of the aforementioned patents relating to the use the $Fe^{2+}/Fe^{3+}$ redox system are incorporated herein by reference.

Suitable additive compounds may be, for example, polymeric oxygen-containing compounds, organic sulfur compounds, thiourea compounds, polymeric phenazonium compounds and polymeric nitrogen compounds, and mixtures or combinations of any two or more of any of these additive compounds.

Suitable, exemplary, polymeric oxygen-containing compounds may comprise one or more of the following: carboxymethyl cellulose, nonylphenol-polyglycol ether, octanediol-bis-(polyalkyleneglycol ether), octanolpolyalkyleneglycol ether, oleic acid polyglycol ester, polyethylene-propyleneglycol copolymer polyethyleneglycol, polyethyleneglycol-dimethylether, polyoxypropyleneglycol, polypropyleneglycol, polyvinyl alcohol, stearic acid polyglycol ester, stearyl alcohol polyglycol ether and β-naphtol polyglycol ether.

Suitable, exemplary thiourea-type compounds may comprise one or more of the following: thiourea, N-acetylthiourea, N-trifluoroacetylthiourea, N-ethylthiourea, N-cyanoacetylthiourea, N-allylthiourea o-tolylthiourea, N,N'-butylene thiourea, thiazolidine thiol, 4-thiazoline thiol, imidazolidine thiol (N,N'-ethylene thiourea), 4-methyl-2-pyrimidine thiol, 2-thiouracil.

Suitable, exemplary phenazonium compounds may comprise one or more of the following: poly(6-methyl-7-dimethylamino-5-phenyl phenazonium sulfate), poly(2-methyl-7-diethylamino-5-phenyl phenazonium chloride), poly(2-methyl-7-dimethylamino-5-phenyl phenazonium sulfate), poly(5-methyl-7-dimethylamino phenazonium acetate), poly(2-methyl-7-anilino-5-phenyl phenazonium sulfate), poly(2-methyl-7-dimethylamino phenazonium sulfate), poly (7-methylamino-5-phenyl phenazonium acetate), poly(7-ethylamino-2,5-diphenyl phenazonium chloride), poly(2,8-dimethyl-7-diethylamino-5-p-tolyl-phenazonium chloride), poly(2,5,8-triphenyl-7-dimethylamino phenazonium sulfate), poly(2,8-dimethyl-7-amino-5-phenyl phenazonium sulfate) and poly(7-dimethylamino-5-phenyl phenazonium chloride).

Suitable, exemplary polymeric nitrogen-containing compounds may comprise one or more of the following: polyethylenimine, polyethylenimide, polyacrylic acid amide, polypropylenimine, polybutylenimine, N-methylpolyethylenimine, N-acetylpolyethylenimine and N-butylpolyethylenimine.

In principle, copper ions will be consumed during the electrodeposition process on the multilayer-substrate. However, in order to regain copper ions in the electrolyte bath, they cannot be directly supplied by the insoluble dimensionally stable anodes. Instead they will be provided by chemically dissolving a source of copper metal, i.e. a sacrificial anode made of copper or copper-containing shaped bodies. The dissolving of the source of copper metal may be realized and/or controlled in a secondary reactor and the electrodeposition may be realized and/or controlled in a primary reactor, with both reactors connected. The secondary reactor may be connected with a primary reactor in order to provide a circulation of the electrolyte bath between the secondary and primary reactor in an appropriate flow rate.

In this redox system, copper ions are formed from the source of copper metal (sacrificial anode or copper-containing shaped bodies) in a redox reaction with dissolved Fe(III) salts as oxidizing agent. In other words, the Fe(III) ions are reduced to Fe(II) ions, whereas the source copper metal being oxidized to form Cu(II) ions. By means of this redox reaction, the total concentration of the copper ions needed for the electrodeposition process is kept relatively constant in the electrolyte bath. Further, the insoluble dimensionally stable anodes, on which the actual voltage is applied, remain the same uniform size. As will be recognized, the following reactions take place:

At the insoluble dimensionally stable anodes (electrodeposition process):

$Fe^{2+} \rightarrow Fe^{3+} + e^-$

At the cathode, i.e. at the multi-layer substrate (electrodeposition process):

$Cu^{2+} + 2e^- \rightarrow Cu^\circ$ (main reaction)

$Fe^{3+} + e^- \rightarrow Fe^{2+}$ (minor reaction)

At the source of copper metal (electroless regain of $Cu^{2+}$):

$Cu^\circ + 2Fe^{3+} \rightarrow Cu^{2+} + 2Fe^{2+}$

When applying the voltage to the substrate, the local current density diverges between areas with vias and grate structure (so called high hole density areas, HHD areas) and without vias or areas without vias as well as it depends on the hole-density of the vias in a particular area. HHD areas typically have a lower local current density compared to areas without vias. Further, the higher the hole-density of the vias, the lower the local current density. In that context, a HHD surface factor for a particular area of a substrate is defined as ratio between the total surface including the inner surfaces of all vias or grate structures (also called total grid area or total grid surface) and the peripheral surface of the corresponding area (also called grid surface). The higher the HHD surface factor, the more vias, respectively, the smaller the hole pitch (distance between via-midpoints), smaller the diameter of the via and the lower the current density.

In the electrodeposition process described above, the local current efficiency, i.e. the efficiency with which electrons are transferred in a system facilitating an electrochemical reaction (here the deposition of copper), correlates to the local current density. Therefore, the higher the HHD surface factor, the lower the local current density, the lower the local current efficiency, i.e. the smaller the layer thickness from the copper deposition.

In the redox system described above, the local current efficiency further depends on the $Fe^{3+}$ concentration in the electrolytic bath, i.e. the higher the $Fe^{3+}$ concentration, the smaller the thickness of the deposited copper layer.

Further, in the redox system described above, the local current efficiency depends on the temperature, i.e. the higher the temperature, the smaller the thickness of the deposited copper layer.

Further, in the redox system described above, the local current efficiency depends on the duration of the reverse current pulse, i.e. the longer the duration of the reverse current pulse, the smaller the thickness of the deposited copper layer.

According to one embodiment, the electrical voltage is applied in a reverse pulse form with bipolar pulses including a forward current pulse and a reverse current pulse.

In another embodiment, the local current efficiency is controlled by adjusting at least one of the concentration of the source of copper ions, the concentration of the source of ferrous ions, the concentration of the source of ferric ions, the duration of the reverse current pulse and the temperature of the electrolytic bath. Preferably, the local current efficiency is controlled by adjusting at least one of the concentrations of the source of ferric ions, the duration of the reverse current pulse, and the temperature of the electrolytic bath.

In particular, the current efficiency drops if the concentration of ferrous ions and/or the temperature of the electrolytic bath is increased. Furthermore, the current efficiency also drops if the duration of the reverse pulse is shortened. On the other hand, the current efficiency increases along with an increase of copper(II) ion concentration.

According to one embodiment, the electrolytic bath comprises the source of copper ions at a concentration in the range from 20 to 150 g/l, and/or the source of ferrous ions at a concentration in the range from 1 to 40 g/l, and/or the source of ferric ions at a concentration in the range from 0.1 to 40 g/l.

The duration of the reverse current pulse may be adjusted in the range of 0 to 200 milliseconds.

Further, the duration of the forward current pulse may be adjusted in the range of 0 to 200 milliseconds.

In another aspect of the invention, a high density interconnect printed circuit board (HDI PCB), including through-holes 20 filled with copper, is obtained by the method described above.

REFERENCE SIGNS 10 multi-layer substrate
12 insulating layers
14 electrically conductive interlayer
16 cover layer
20 through-hole
22 inner surface
30, 32 grate structures
34, 35 walls of the grate structures
36 slot
40 non-copper conductive layer or copper layer
50 patterned masking film
60 first copper layer
62 copper inner-seal
64 blind-microvias
66 copper inlay
70 copper filling

The invention claimed is:

1. A method of preparing a high density interconnect printed circuit board (HDI PCB) or integrated circuit (IC) substrates including through-holes and/or grate structures filled with copper, the method comprising the steps of:
   a) providing a substrate (10) comprising
      (i) an insulating core layer (12) having a peripheral surface, or
      (i') a stack assembly comprising an insulating core layer (12) embedded between two electrically conductive interlayers (14) and at least one outer insulating layer (13) attached on the electrically conductive interlayer (14) and having a peripheral surface,
      (ii) an optional cover layer (16) covering the peripheral surface, and
      (iii) at least one through-hole (20) extending through all layers of the substrate (10) and/or
      a grate structure (30, 32) having multiple slots (36) extending through the optional cover layer (16) and partially extending in the insulating core layer (12) or extending through at least the optional cover layer (16) and at least one of the outer insulating layers (13);
   b) forming a non-copper conductive layer (40) or a copper layer (40) on the cover layer (16) when present, or on the insulating core layer (12) or (13) when the cover layer is not present, and on an inner surface (22) of the through-hole (20) when present, and on an inner surface of the grate structure (30, 32) when present;
   c) forming a patterned masking film (50) on the non-copper conductive layer (40) or on the copper layer (40);
   d) electrodepositing a copper inner-seal (62) inside the through-hole (20) sufficient to form two blind-microvias (64), electrodepositing a copper inlay (66) on the non-copper conductive layer (40) or on the copper layer (40) of the inner surface of the grate structure (30, 32) and a first copper layer (60) on the remaining peripheral surface of the non-copper conductive layer (40) or of the copper layer (40), in one step;
   e) removing the masking film (50); and
   f) electrodepositing a copper filling (70) in the blind-microvias (64), the copper inlay (66), and on the first copper layer (60) in one step.

2. The method of claim 1, wherein the through-hole (20) has a diameter in a range from 30 µm to 1000 µm and/or the multiple slots (36) have a diameter in a range from 30 µm to 300 µm.

3. The method of claim 1, wherein the non-copper conductive layer (40) of step b) is selected from the group consisting of metal or metal alloy layer; a conductive metal oxide layer; carbon layers made of graphite, graphyne, graphdiyne; organic layers.

4. The method of claim 1, wherein the non-copper conductive layer (40) is formed by one or more of an electroless plating process, an electroless deposition process, a physical deposition process, a chemical vapour deposition process, or a plasma-enhanced chemical vapour deposition process.

5. The method of claim 1, wherein step d) of electrodepositing the copper inner-seal (62) inside the through-hole (20) and a first copper layer (60) includes immersing the multi-layer substrate (10) into an electrolytic bath in an electrolytic copper plating system with the non-copper conductive layer (40) connected as a cathode, the plating system further comprising an insoluble dimensionally stable anode and a source of copper metal, wherein the electrolytic bath comprises an acid, a source of copper ions, a source of $Fe^{2+}$ and/or $Fe^{3+}$ ions, and at least one additive for controlling physical-mechanical properties of deposited copper; and applying an electrical voltage between the insoluble dimensionally stable anode and the non-copper conductive layer (40), so that a current flows there between for a time sufficient to electrodeposit copper to form the copper inner-seal (62) and a first copper layer (60) on the peripheral non-copper conductive layer (40), wherein a $Fe^{2+}/Fe^{3+}$ redox system is established in the electrolytic bath to provide additional copper ions to be electrodeposited by dissolving copper ions from the source of copper metal.

6. The method of claim 1, wherein step f) of electrodepositing the copper filling (70) includes immersing the multi-layer substrate (10) into an electrolytic bath in an electrolytic copper plating system with the non-copper conductive layer (40) connected as a cathode, the plating system further comprising an insoluble dimensionally stable anode and a source of copper metal, wherein the electrolytic bath comprises an acid, a source of copper ions, a source of $Fe^{2+}$ and/or $Fe^{3+}$ ion, and at least one additive for controlling physical-mechanical properties of deposited copper; and applying an electrical voltage between the insoluble dimensionally stable anode and the copper layer (40) or non-copper conductive layer (40), so that a current flows there between for a time sufficient to electrodeposit copper to form the copper filling (70) in the blind-microvia (64) and copper inlay (66) while reducing the layer thickness of the first copper layer (60), wherein a $Fe^{2+}/Fe^{3+}$ redox system is established in the electrolytic bath to provide additional copper ions to be electrodeposited by dissolving copper ions from the source of copper metal other than the copper of the first copper layer (60).

7. The method of claim 5, wherein the source of ferric ions comprises Fe(III) salts, selected from the group consisting of iron(III) sulfate nonahydrate, iron(III) acetate, iron(III) propionate, iron(III) benzoate, and iron(III) hexafluorosilicates.

8. The method of claim 5, wherein the electrical voltage is applied in a reverse pulse form with bipolar pulses including a forward current pulse and a reverse current pulse.

9. The method of claim 8, wherein the local current efficiency is controlled by adjusting at least one of
concentration of the source of copper ions,
concentration of the source of ferrous ions,
concentration of the source of ferric ions,
duration of the reverse current pulse and
temperature of the electrolytic bath.

10. The method of claim 9, wherein the electrolytic bath comprises
the source of copper ions at a concentration in the range from 20 to 150 g/l, and/or
the source of ferrous ions at a concentration in the range from 1 to 40 g/l, and/or
the source of ferric ions at a concentration in the range from 0.1 to 40 g/l.

11. The method of claim 9, wherein the duration of the reverse current pulse is adjusted in the range from 0 to 200 milliseconds.

12. The method of claim 1, wherein a HDD surface factor of the at least one through-hole (20) extending through all layers of the substrate (10) and/or
the grate structure (30, 32) having multiple slots (36) extending through the optional cover layer (16) and partially extending in the insulating core layer (12) or extending through at least the optional cover layer (16) and at least one of the outer insulating layers (13) is from 1.1 to 5.

13. The method of claim 1, wherein the resulting thickness of the copper filling of step f) leads to a copper layer thickness to a thin and even copper layer thickness over the through hole and/or grate structure from 10 to 300 μm.

14. The method of claim 1, wherein a difference of heights of the resulting copper plating thickness over the through hole and/or grate structure of step f) is from 0 to 40% compared to a height having no through hole and/or grate structure.

15. The method of claim 6, wherein the source of ferric ions comprises Fe(III) salts, selected from the group consisting of iron(III) sulfate nonahydrate, iron(III) acetate, iron(III) propionate, iron(III) benzoate, and iron(III) hexafluorosilicates.

16. The method of claim 6, wherein the electrical voltage is applied in a reverse pulse form with bipolar pulses including a forward current pulse and a reverse current pulse.

17. The method of claim 16, wherein the local current efficiency is controlled by adjusting at least one of
concentration of the source of copper ions,
concentration of the source of ferrous ions,
concentration of the source of ferric ions,
duration of the reverse current pulse and
temperature of the electrolytic bath.

18. The method of claim 17, wherein the electrolytic bath comprises
the source of copper ions at a concentration in the range from 20 to 150 g/l, and/or
the source of ferrous ions at a concentration in the range from 1 to 40 g/l, and/or
the source of ferric ions at a concentration in the range from 0.1 to 40 g/l.

19. The method of claim 17, wherein the duration of the reverse current pulse is adjusted in the range from 0 to 200 milliseconds.

* * * * *